(12) United States Patent
Matsumura et al.

(10) Patent No.: US 7,936,165 B2
(45) Date of Patent: May 3, 2011

(54) CURRENT SENSOR

(75) Inventors: Norio Matsumura, Makinohara (JP); Tatsuya Aoki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 82 days.

(21) Appl. No.: 12/545,918

(22) Filed: Aug. 24, 2009

(65) Prior Publication Data

US 2010/0066350 A1   Mar. 18, 2010

(30) Foreign Application Priority Data

Sep. 18, 2008   (JP) ................................ 2008-238955

(51) Int. Cl.
*G01R 1/20* (2006.01)
*G01R 15/20* (2006.01)

(52) U.S. Cl. ..................................... 324/126; 324/117 H

(58) Field of Classification Search .............. 324/117 R, 324/117 H, 120, 126–127, 250–252
See application file for complete search history.

(56) References Cited

U.S. PATENT DOCUMENTS

| | | | | |
|---|---|---|---|---|
| 3,684,955 A | * | 8/1972 | Adams | 324/72 |
| 4,709,205 A | * | 11/1987 | Baurand et al. | 324/127 |
| 4,749,940 A | * | 6/1988 | Bullock | 324/127 |
| 5,066,904 A | * | 11/1991 | Bullock | 324/127 |
| 5,552,700 A | * | 9/1996 | Tanabe et al. | 324/117 H |
| 5,587,651 A | * | 12/1996 | Berkcan et al. | 324/127 |
| 5,672,073 A | * | 9/1997 | Matsumura et al. | 439/489 |
| 5,707,248 A | * | 1/1998 | Matsumura | 439/489 |
| 6,184,660 B1 | * | 2/2001 | Hatular | 320/141 |
| 6,426,617 B1 | * | 7/2002 | Haensgen et al. | 324/117 H |
| 6,759,840 B2 | * | 7/2004 | Marasch et al. | 324/117 H |
| 6,781,359 B2 | * | 8/2004 | Stauth et al. | 324/117 H |
| 6,791,313 B2 | * | 9/2004 | Ohtsuka | 324/117 H |
| 7,084,617 B2 | * | 8/2006 | Ozaki et al. | 324/117 H |
| 7,463,016 B2 | * | 12/2008 | Shoji | 324/117 R |
| 7,545,138 B2 | * | 6/2009 | Wilkerson et al. | 324/127 |
| 7,679,357 B2 | * | 3/2010 | Aratani et al. | 324/117 H |
| 2005/0237049 A1 | * | 10/2005 | Ozaki et al. | 324/117 H |
| 2007/0096716 A1 | * | 5/2007 | Shoji | 324/117 H |
| 2008/0048642 A1 | * | 2/2008 | Aratani et al. | 324/117 H |
| 2009/0128129 A1 | * | 5/2009 | Aratani | 324/117 H |

FOREIGN PATENT DOCUMENTS

JP         2009-150654 A      7/2009

* cited by examiner

*Primary Examiner* — Ha Tran T Nguyen
*Assistant Examiner* — Joshua Benitez
(74) *Attorney, Agent, or Firm* — Sughrue Mion, PLLC

(57) ABSTRACT

A current sensor includes a housing having a pair of first slits, a bus bar supported by the housing and electrically connected to a battery post provided on a battery, an annular shield member arranged so as to surround an axis extending in a direction in which a current is flowed in the bus bar, and a magnetic-electric conversion element provided on the housing to detect a magnetic flux density of a magnetic field generated when the current is flowed in the bus bar and produce an electric signal. The magnetic-electric conversion element is arranged between the first slits. The shield member is inserted into the first slits so that the shield member is mounted on the housing.

4 Claims, 10 Drawing Sheets

CURRENT SENSOR

BACKGROUND

The present invention relates to a current sensor, and in particular to a current sensor comprising: a housing; a bus bar supported by the housing and connected to a battery post provided on a battery, the bus bar conducting a current; an annular shield plate arranged to surround the axis extending in the direction of flow of the current in the bus bar; and a magnetic-electric conversion element arranged on the housing for detecting the magnetic flux density of a magnetic field generated when a current has flowed in the bus bar to produce an electric signal.

FIG. 13 shows a related current sensor 1. The current sensor 1 includes a bus bar 3 as a conductor through which a current flows, a sensor housing 2 formed with the bus bar 3 inserted therein an annular core 4 as a shield plate arranged to surround the Y axis extending in the direction of current flow in the bus bar 3, a Hall IC 5 as a magnetic-electric conversion element for detecting the magnetic flux density of a magnetic field generated when a current has flowed in the bus bar to produce an electric signal, a circuit board 6 for mounting the Hall IC 5; an external output terminal (not shown), and a case 29. The Hall IC 5 is arranged in a space surrounded by the core 4.

On the current sensor 1 thus configured, a magnetic field is generated having a magnetic flux density corresponding to a current flowing in the bus bar 3. The Hall IC 5 converts the magnetic flux density of a magnetic field converged by the core 4 to an electric signal and outputs the electric signal as one corresponding to the current. The core 4 further has a feature to shield the influence of an external magnetic field.

The core 4 is provided so as to be divided into a first divided shield plate 4A and a second divided shield plate 4B. Each of the first divided shield plate 4A and the second divided shield plate 4B is arranged to be fixed to the outer side surface of the case 29. Just fixing the first divided shield plate 4A and the second divided shield plate 4B on the outer side surface of the case 29 allows the bus bar 3 to penetrate the core 4.

The current sensor 1 uses the first divided shield plate 4A and the second divided shield plate 4B as the core 4 and thus has problems of an increase in the number of parts and mounting man-hours.

SUMMARY

In view of the above problems, an object of the invention is to provide a current sensor with reduced number of parts and mounting man-hours.

In order to achieve the above object, according to the present invention, there is provided a current sensor comprising:

a housing having a pair of first slits;

a bus bar supported by the housing and electrically connected to a battery post provided on a battery;

an annular shield member arranged so as to surround an axis extending in a direction in which a current is flowed in the bus bar; and a magnetic-electric conversion element provided on the housing to detect a magnetic flux density of a magnetic field generated when the current is flowed in the bus bar and produce an electric signal, wherein the magnetic-electric conversion element is arranged between the first slits; and wherein the shield member is inserted into the first slits so that the shield member is mounted on the housing.

Preferably, a tip of an external output terminal for outputting the electric signal from the magnetic-electric conversion element is loosely inserted into and passed through a second slit provided on the bus bar, and extends in a direction orthogonal to an end face of the battery where the buttery post is provided.

Preferably, the tip of an external output terminal for outputting the electric signal from the magnetic-electric conversion element extends, in parallel to an end face where the battery post is provided, so as to away from the battery.

As described above, according to the above configuration, the first slits are provided on the housing in order to insert the shield member formed in an annular shape. It is thus possible to mount the shield member by inserting the same into the first slits instead of fixing divided shield plates so as to surround the axis extending in the direction in which the current is flowed in the bus bar. This configuration provides a current sensor with reduced number of parts and mounting man-hours.

According to the above configuration, it is thus possible to effectively use a free space between a connection part to which the load of the bus bar or the like is connected and the battery, thereby downsizing the current sensor.

Also, since the external output terminal and the tip thereof extend in a direction orthogonal to the end face where the battery post is provided, it is possible to mount a battery without being restricted by the peripheral shape of the battery post.

Also, by the above configuration, the external output terminal and the tip thereof extend in parallel to the end face of the battery where the battery post is arranged, so as to away from the battery. This makes it possible to mount a Hall IC without influencing the shape, for example punching out the sheet metal to create a second slit.

Also, the external output terminal and the tip thereof extend parallel to the end face of the battery where the battery post is arranged. This makes it possible to mount a battery without being restricted by the peripheral shape of the battery post.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

The first embodiment of the invention will be described based on FIGS. 1 to 11. The current sensor 1 according to a first embodiment of the invention is connected to one of the battery posts as a pair for the battery 9 via a battery terminal 94.

Figure 1:
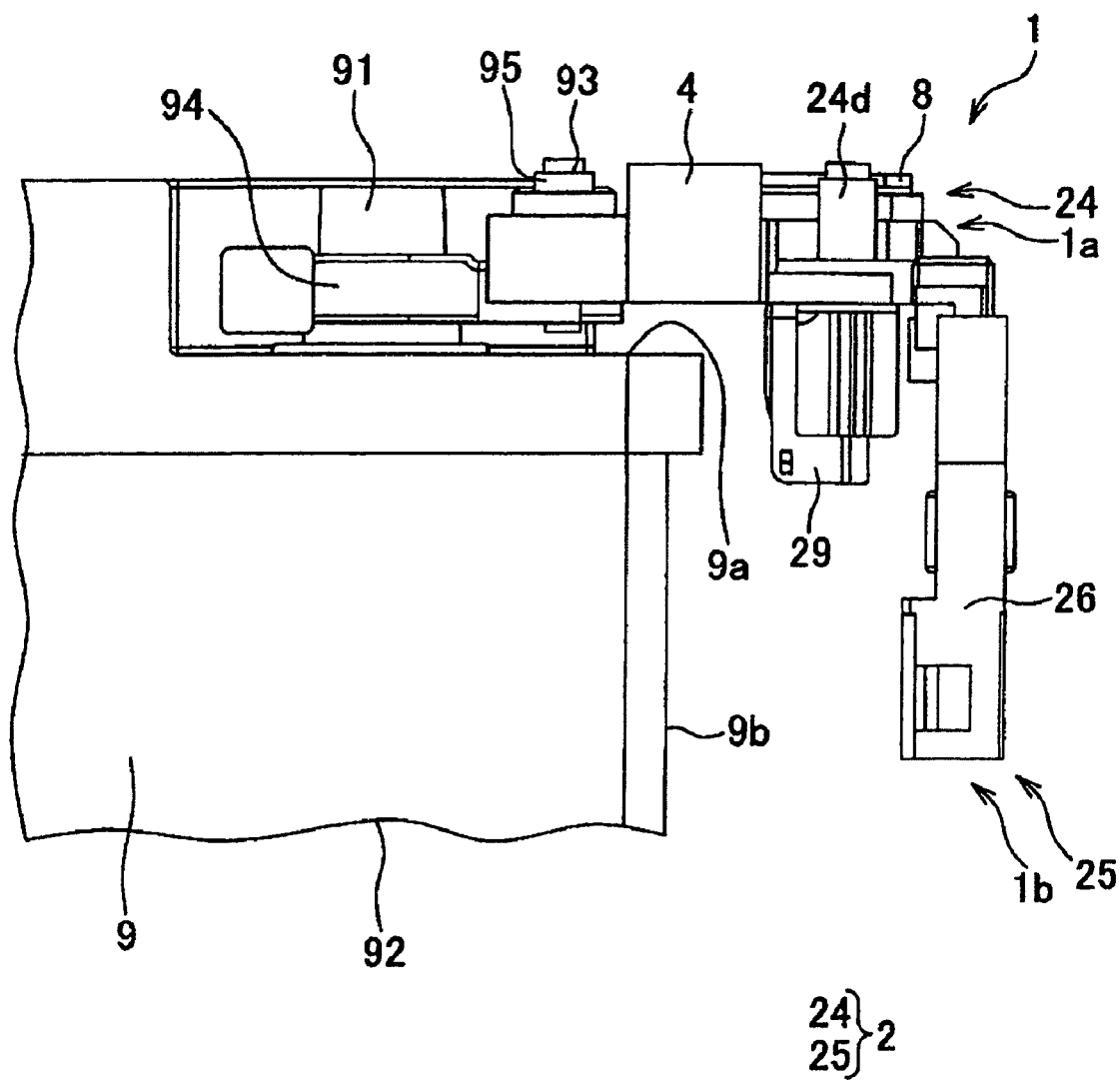
FIG. 1 is a side view of a current sensor according to the first embodiment of the invention with a bus bar mounted thereon.

As shown in FIG. 1, the battery 9 includes at least an accommodating case 92 and a pair of battery posts (only one post is shown). The accommodating case 92 is composed of an insulating synthetic resin or the like and formed in a box shape. The accommodating case 92 accommodates, for example, a plurality of cell plates electrically connected to each other.

Each of the battery posts as a pair is formed in an almost cylindrical shape and has one end protruding from the end surface 9a of the battery 9 and the other end electrically connected to the cell plates positioned at both ends among the plurality of cell plates accommodated in the accommodating case 92. To one battery post 91 of the battery posts as a pair (hereinafter simply referred to as the battery post 91) is connected a battery terminal 94. The current sensor 1 is connected to the battery post 91 via the battery terminal 94.

As shown in FIG. 1, the current sensor 1 is generally formed in an almost L shape. The current sensor 1 has one end 1a arranged parallel to the end surface 9a of the battery 9 and the other end 1b arranged parallel to the side surface 9b of the battery 9. The current sensor 1 includes a bus bar 3 including a second slit 35, a sensor housing 2 as a housing including a first slit 20 where the bus bar 3 is insert-molded, a core 4 as a shield plate, a Hall IC 5 as a magnetic-electric conversion element, a circuit board 6 mounting the Hall IC 5, an external output terminal 7 for outputting an electric signal coming from the Hall IC 5, and a cover material 8.

Figure 2:
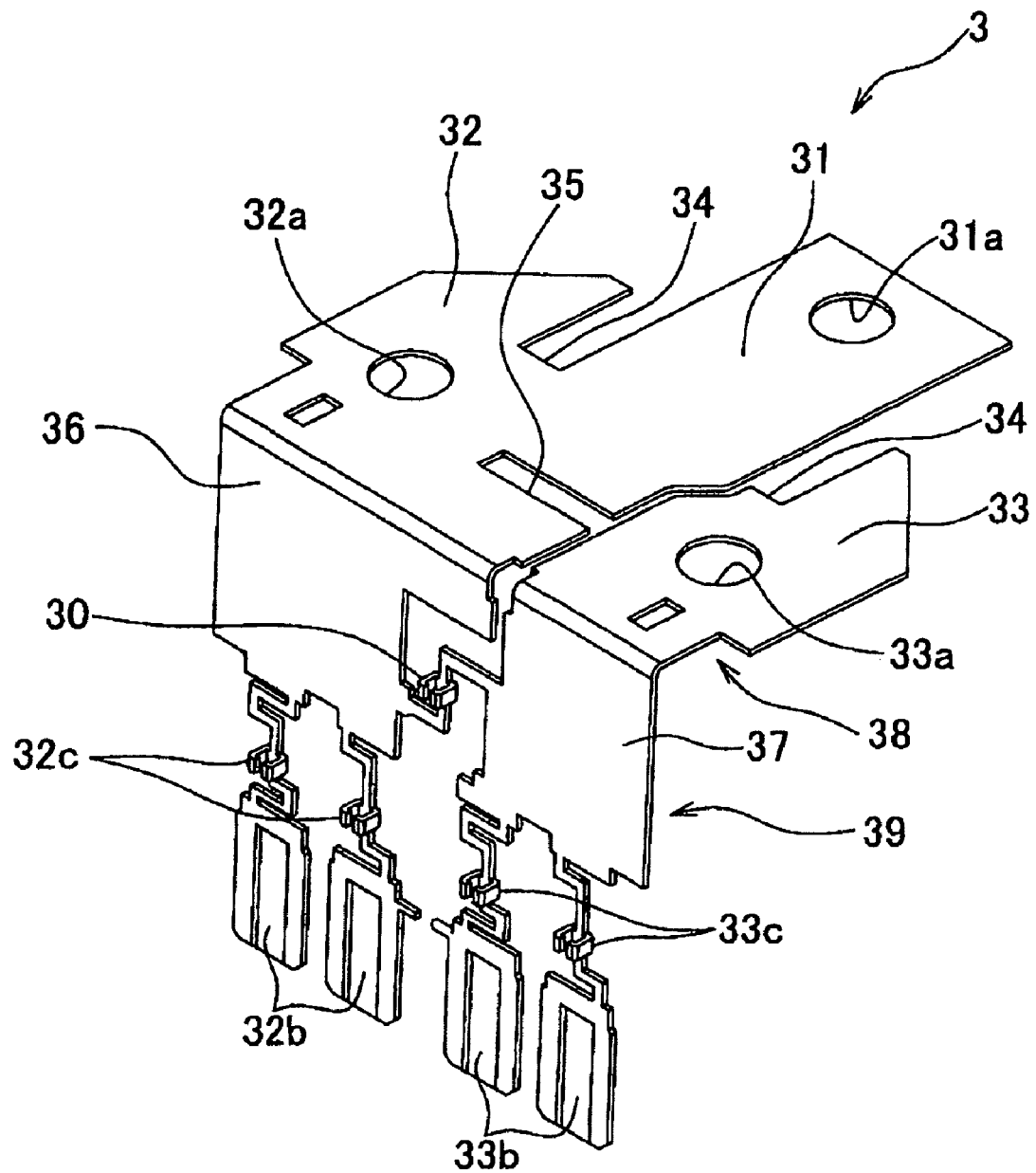
FIG. 2 is a perspective view of a bus bar of the current sensor shown in FIG. 1.

The bus bar 3 is formed by stamping conductive sheet metal. As shown in FIG. 2, the bus bar 3 is formed in an almost L shape with a first flat plate 38 and a second flat plate 39 connected orthogonally to the end of the first flat plate 38. As shown in FIG. 2, the bus bar 3 includes a power source bus bar 31 including second slit 35, a starter bus bar 32, an alternator bus bar 33, and a fuse element 30.

The power source bus bar 31 includes a pair of first slits 34, a second slit 35, and a connection hole 31a. The power source bus bar 31 is formed into an almost rectangular shape and arranged in the center of the first flat plate 38. The power source bus bar 31 is arranged parallel to the end surface 9a of the battery 9. The power source bus bar 31 is insert-molded in the center of the horizontal part 24 (described later) of the sensor housing 2.

The first slits 34 as a pair are arranged on both side parts of the power source bus bar 31. One of the first slits 34 as a pair extends in a straight line between one part side of the power source bus bar 31 and one side part of the starter bus bar 32. The other of the first slits 34 as a pair extends in a straight line between the other side part of the power source bus bar 31 and one side part of the alternator bus bar 33. Each of the first slits 34 as a pair is notched while including an opening from the end of the first flat plate 38 that is away from the second flat plate 39, the first slits 34 extending parallel to each other. The first slit 34 penetrates the power source bus bar 31. The first slit 34 is arranged so that the core 4 described later may be inserted into the first slit 34 via an opening provided at the end thereof. The first slit 34 is covered with insert-molding to form a first slit 20 described later.

Figure 6:
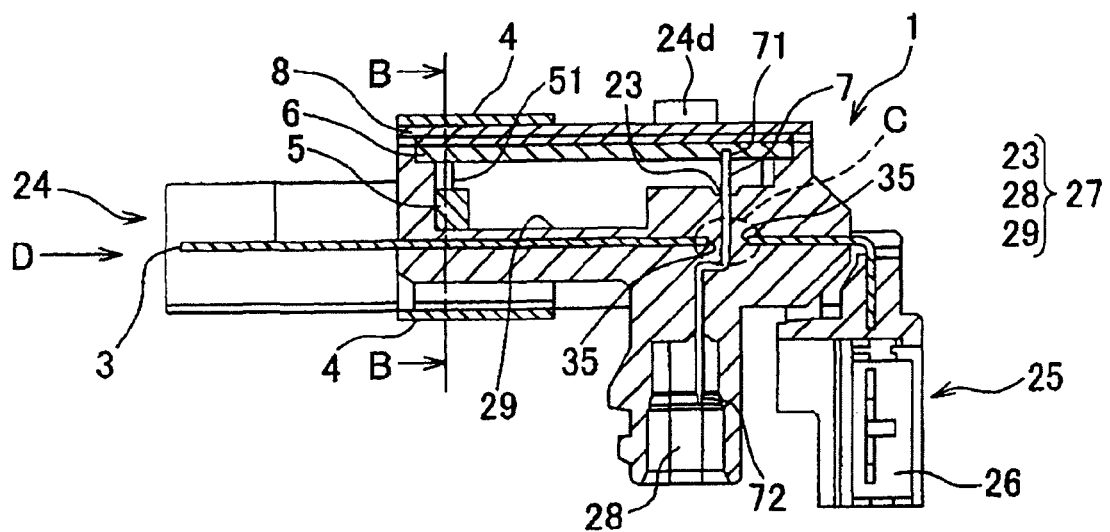
FIG. 6 is a cross-sectional view taken along line A-A of FIG. 5.
Figure 7:
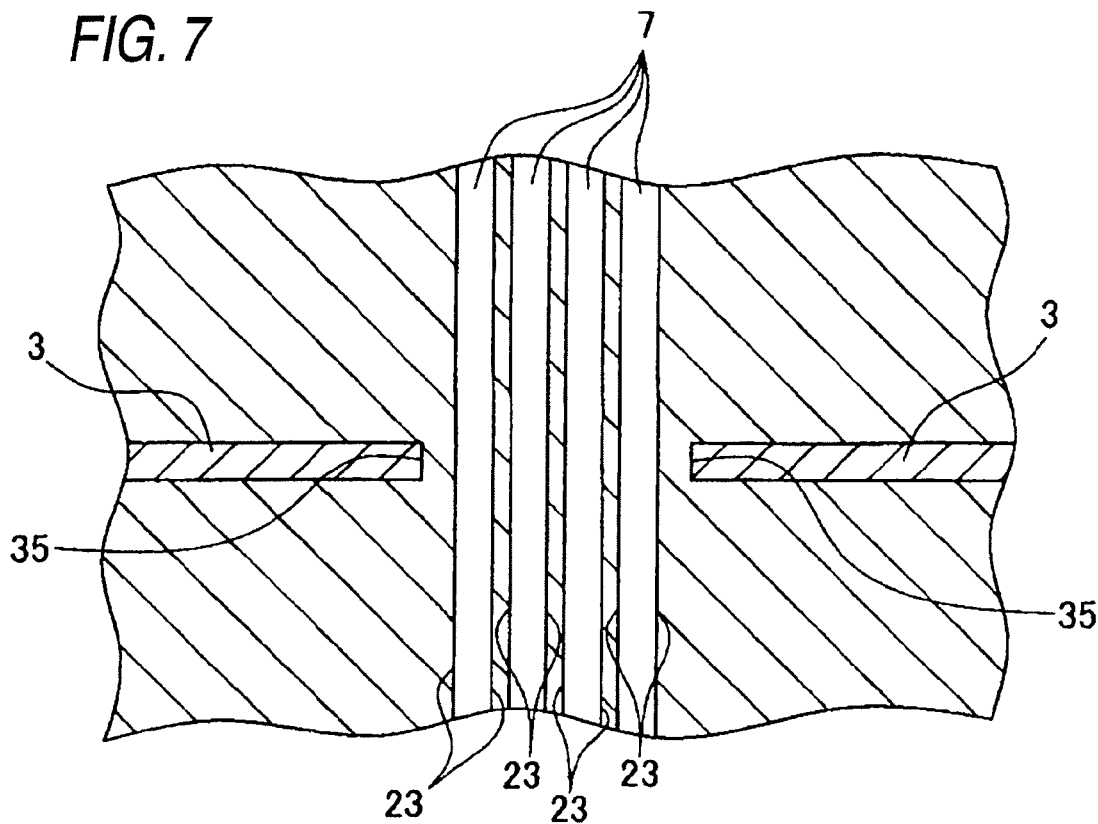
FIG. 7 is an enlarged view of a principal section showing an enlarged portion C of the current sensor viewed in the direction of the arrow D shown in FIG. 6.
Figure 8:
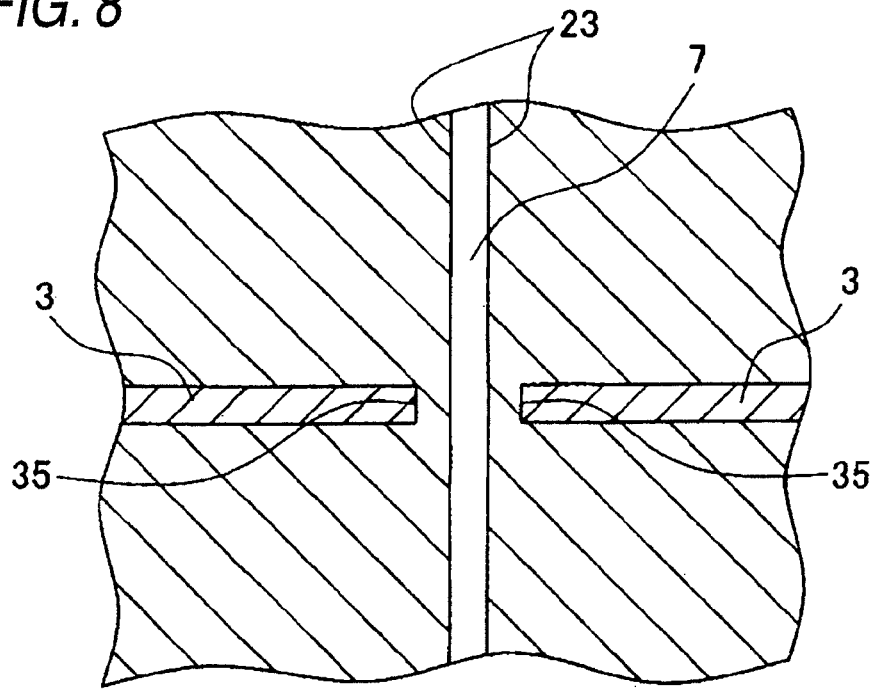
FIG. 8 is an enlarged view of a principal section showing an enlarged portion C of the current sensor shown in FIG. 6.

The second slit 35 is positioned at the end of the first flat plate 38 of the power source bus bar 31 close to the second flat plate 39 while the second slit 35 is sandwiched between the first slits 34 as a pair. The second slit 35 extends in a straight line in a direction orthogonal to the pair of first slits 34. The second slit 35 penetrates the power source bus bar 31. The second slit 35 has an external output terminal 7 arranged thereon in an almost rectangular shape in a loosely insertable fashion. As shown in FIGS. 6 to 8, the external output terminal 7 described later is loosely inserted into the second slit 35. The second slit 35 is embedded in the sensor housing 2 so as not to come into contact with the external output terminal 7 described later and the bus bar 3 in which a current flows. Thus, the second slit 35 arranged on the bus bar 3 in which a current flows and the external output terminal 7 described later are insulated from each other.

The connection hole 31a is arranged in the first flat plate 38. The connection hole 31a is circular in plan view and penetrates the power source bus bar 31 in the center. The connection hole 31a has a stud bolt 93 for the battery terminal 94 threaded therein. Into the stud bolt 93 threaded in the connection hole 31a is screwed a nut 95 to connect (fix) the current sensor 1 to the battery terminal 94.

The starter bus bar 32 includes a main body 36, a connection bus bar 32b, and a fuse element 32c. The starter bus bar 32 is formed into an almost L shape and forms part of the first flat plate 38 and part of the second flat plate 39. The starter bus bar 32 is connected to one side part of the power source bus bar 31. The side part of the starter bus bar 32 close to the alternator bus bar 33 is connected to the side part of the alternator bus bar 33 close to the starter bus bar 32 via a fuse element 30 described later on the second flat plate 39. The starter bus bar 32 is insert-molded over part of the horizontal part 24 described later and part of the suspending part 25 of the sensor housing 2.

The main body 36 is formed into an almost L shape and is part of the first flat plate 38 and part of the second flat plate 39. The main body 36 includes a bolt hole 32a.

The bolt hole 32a is arranged in the center of the first flat plate 38 of the main body 36. The bolt hole 32a is circular in plan view and penetrates the starter bus bar 32.

The connection bus bar 32b is formed into a flat plate shape and is arranged at the end of the main body 36 away from the first flat plate 38 via a fuse element 32c described later. The connection bus bar 32b is insert-molded on the suspending part 25 of the sensor housing 2. A plurality of (two in this embodiment) connection bus bars 32b are provided.

Each of the two connection bus bars 32b has one end electrically connected to the main body 36 of the starter bus bar 32 via the fuse element 32c and the other end connected to a load (not shown).

The fuse element 32c has one end connected to the end of the main body 36 away from the first flat plate 38 and the other end arranged at one end of the connection bus bar 32b. The fuse element 32c is insert-molded on the suspending part 25 of the sensor housing 2 Two fuse elements 32c corresponding to two connection bus bars 32b are provided. The fuse element 32c integrally includes a pair of connecting pieces and a molten-down piece arranged between the connecting pieces as a pair. Each of the two fuse elements has one connecting piece connected to the other end of the main body 36 of the starter bus bar 32 and the other connecting piece connected to its corresponding connection bus bar 32b.

The molten-down piece is formed of a metal having a relatively low melting point and melts down by self heating when an overcurrent flows into the current sensor 1. When the molten-down piece melts down, electric connection between the power source bus bar 31, main body 36 of the starter bus bar 32 and the connection bus bar 32b is lost to prevent an accident caused by an overcurrent.

The alternator bus bar 33 includes a main body 37, a connection bus bar 33b, and a fuse element 33c. The alternator bus bar 33 is formed into an almost L shape and forms part of the first flat plate 38 and part of the second flat plate 39. The alternator bus bar 33 is connected to the other side part of the power source bus bar 31 via spacing. The side part of the alternator bus bar 33 close to the starter bus bar 32 is connected the side part of the starter bus bar 32 close to the alternator bus bar 33 via a fuse element 30 described later on the second flat plate 39. The alternator bus bar 33 is insert-molded over part of the horizontal part 24 described later and part of the suspending part 25 of the sensor housing 2.

The main body 37 is formed into an almost L shape and forms part of the first flat plate 38 and part of the second flat plate 39. The main body 37 includes a bolt hole 33a.

The bolt hole 33a is arranged in the center of the first flat plate 38 of the main body 37. The bolt hole 33a is circular in plan view and penetrates the alternator bus bar 33.

The connection bus bar 33b is formed into a flat plate shape and is arranged at the end of the main body 37 away from the first flat plate 38 via a fuse element 33c described later. The connection bus bar 33b is insert-molded on the suspending part 25 of the sensor housing 2. A plurality of (two in this embodiment) connection bus bars 33b are provided.

Each of the two connection bus bars 33b has one end electrically connected to the main body 37 of the alternator bus bar 33 via the fuse element 33c and the other end connected to a load (not shown).

The fuse element 33c has one end connected to the end of the main body 37 away from the first flat plate 38 and the other end arranged at one end of the connection bus bar 33b. The fuse element 33c is insert-molded on the suspending part 25 of the sensor housing 2. Two fuse elements 33c corresponding to two connection bus bars are provided. The fuse element 33c integrally includes a pair of connecting pieces and a molten-down piece arranged between the connecting pieces as a pair. Each of the two fuse elements has one connecting piece connected to the other end of the main body 37 of the alternator bus bar 33 and the other connecting piece connected to its corresponding connection bus bar 33b.

The molten-down piece is formed of a metal having a relatively low melting point and melts down by self heating when an overcurrent flows into the current sensor 1. When the molten-down piece melts down, electric connection between the main body 37 of the alternator bus bar 33 and the connection bus bar 33b is lost to prevent an accident caused by an overcurrent.

The fuse element 30 is arranged between the starter bus bar 32 and the alternator bus bar 33 on the second flat plate 39 of the bus bar 3. The fuse element 30 is insert-molded on the suspending part 25 of the sensor housing 2. The fuse element 30 integrally includes a pair of connecting pieces and a molten-down piece arranged between the connecting pieces as a pair. The fuse element 30 has one connecting piece connected to the starter bus bar 32 and the other connecting piece connected to the alternator bus bar 33.

The molten-down piece is formed of a metal having a relatively low melting point and melts down by self heating when an overcurrent flows into the current sensor 1. When the molten-down piece melts down, electric connection between the power source bus bar 31, starter bus bar 32 and the alternator bus bar 33 is lost to prevent an accident caused by an overcurrent.

The sensor housing 2 is composed of a synthetic resin such as a nylon resin or a polypropylene resin that is relatively heat-resistant. The sensor housing 2 is generally formed into an almost L shape and, as shown in FIG. 1, is composed of a horizontal part 24 covering the first flat plate 38 of the bus bar 3 and the suspending part 25 orthogonal to the horizontal part 24 and covering the second flat plate 39 of the bus bar 3. The sensor housing 2 integrally insert-molds the horizontal part 24, suspending part 25, and an external output terminal 7 described later.

The horizontal part 24 covers the power source bus bar 31, part of the starter bus bar 32, and part of the alternator bus bar 30 via insert-molding. The horizontal part 24 includes the first slit 20, exposed parts 24a, 24b, 24c, connection bolts 24d, 24e, a radiator plate 26a, and a sensor case 27. The horizontal part 24 integrally embeds the first flat plate 38 of the bus bar 3, the case 29 of the sensor case 27 described later, and a housing 28 in the sensor housing 2.

Figure 3:
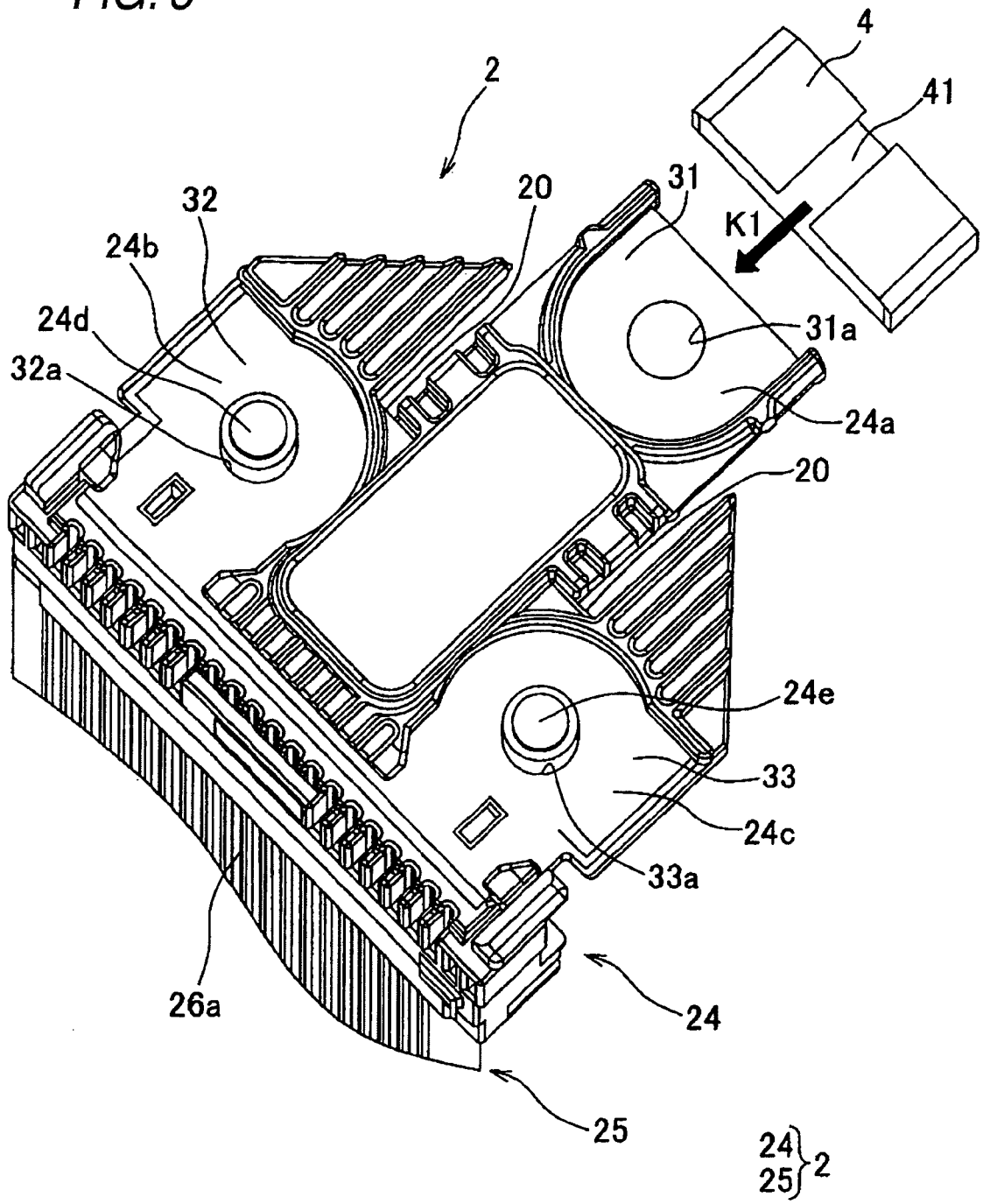
FIG. 3 is a perspective view of a sensor housing of the current sensor shown in FIG. 1.
Figure 4:
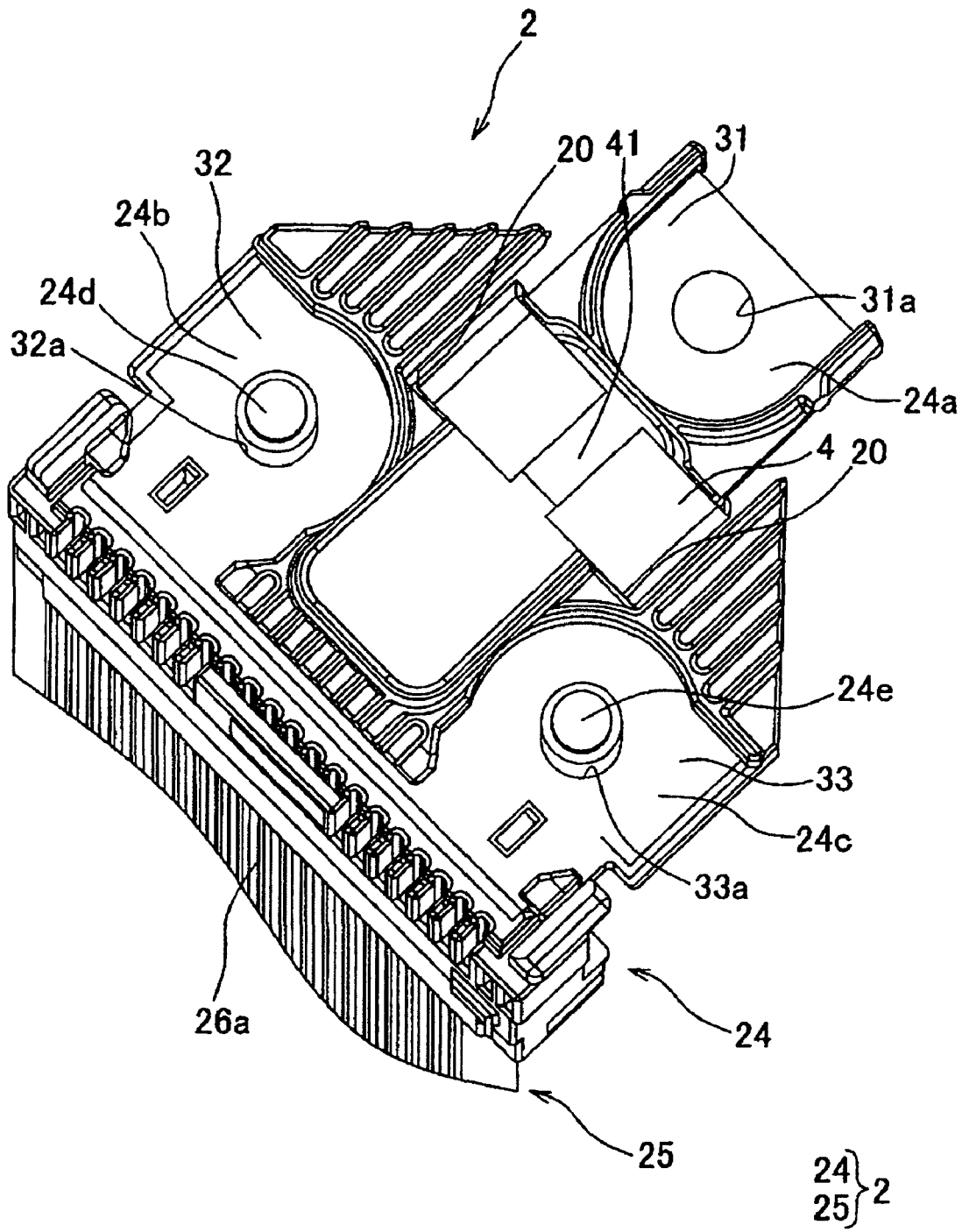
FIG. 4 is a perspective view of the current sensor shown in FIG. 3 with a core inserted therein.
Figure 5:
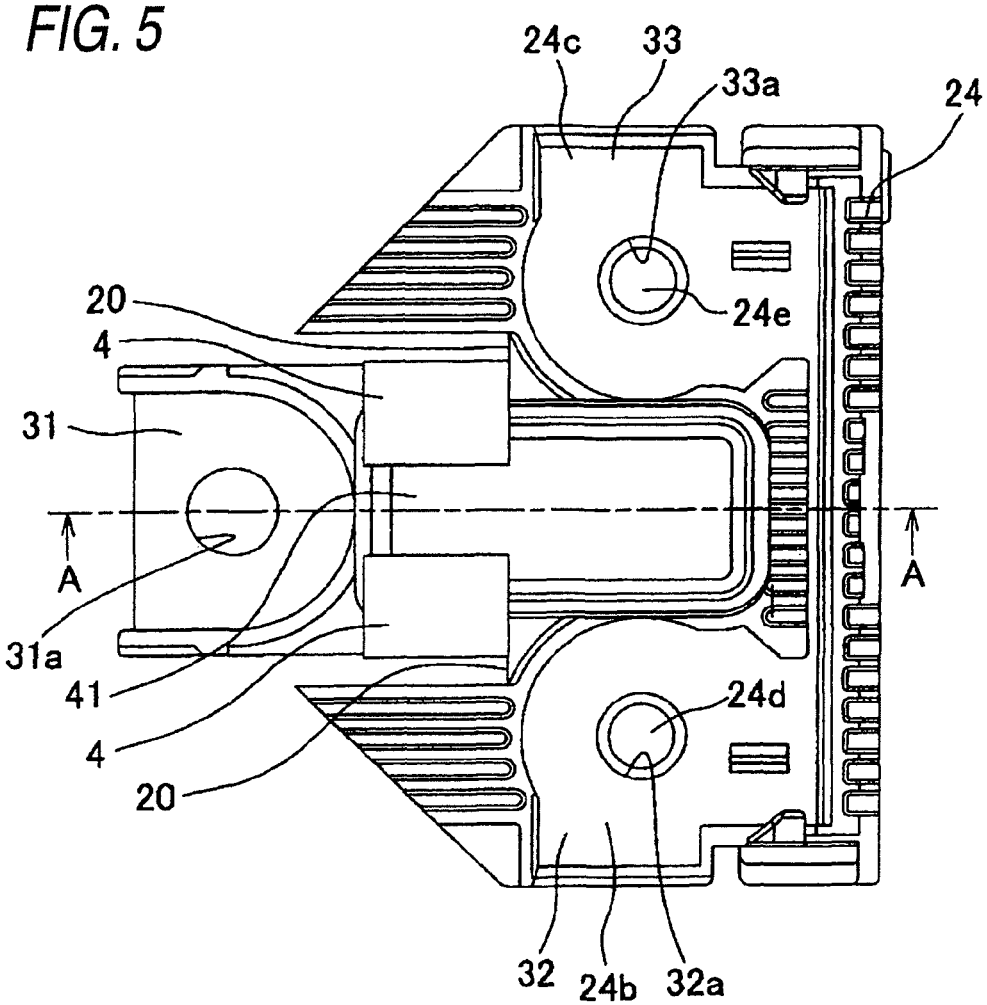
FIG. 5 is a top view of the current sensor shown in FIG. 1.

The first slit 20 is formed by covering the first slit 34 arranged on the bus bar 3 with insert-molding. The first slit 20 arranged on the horizontal part 24 penetrates the first slit 34 arranged on the power source bus bar 31. The first slit 20 is notched while including an opening at the end of the horizontal part 24 away from the suspending part 25. The first slits 20 are integrally formed and extend parallel to each other in a straight line. The inner surface of the first slit 20 is covered by the sensor housing 2 to prevent a core 4 described later from coming into contact with the bus bar 3 in which a current flows. The first slit 20 insulates the bus bar 3 in which a current flows from the core 4 described later. As shown in FIG. 3, a Hall IC 5 described later is positioned in a space surrounded by the core 4 through an opening arranged in the first slit 20 by moving the core 4 in the direction of an arrow K1. As shown in FIG. 4, when a current flows in the bus bar 3, the core 4 arranged to surround the axis extending in the direction of current flow concentrates the magnetic flux density of a magnetic field. The Hall IC 5 converts the concentrated magnetic flux density to an electric signal and the external output terminal 7 outputs the electric signal.

The exposed part 24a partially notches both surfaces of the horizontal part 24 from the end of the horizontal part 24 away from the suspending part 25. The exposed part 24a externally exposes the connection hole 31a and the neighborhood of the connection hole 31a of the power source bus bar 31. The exposed part 24b and exposed part 24c partially notch both surfaces of the horizontal part 24 from the end of the horizontal part 24 close to the suspending part 25. The exposed part 24b externally exposes the bolt hole 32a and the neighborhood of the bolt hole 32a of the starter bus bar 32. The exposed part 24c externally exposes the bolt hole 33a and the neighborhood of the bolt hole 33a of the alternator bus bar 33.

The connection bolt 24d is integrally insert-molded on the sensor housing 2 with a bolt. (not shown) threaded in the bolt hole 32a. The connection bolt 24e is integrally insert-molded on the sensor housing 2 with a bolt (not shown) threaded in the bolt hole 33a.

A plurality of radiator plates 26a are formed in a band plate shape (rib shape) and protrude from the outer surface of the suspending part 25 away from the battery 9. The plurality of radiator plates 26a are arranged parallel to each other with spacing provided therebetween.

The sensor case 27 includes a case 29, a terminal output hole 23, and a housing 28.

As shown in FIG. 6, the case 29 is arranged in a frame shape in the center (on the power source bus bar 31) of the horizontal part 24. The case 29 arranges a stepped part 29a and a stepped part 29b on the inner surface thereof over the entire circumference. On the bottom surface of the case 29 is mounted a Hall IC 5 described later. The stepped part 29a that is close to the bottom surface is mounted on the stepped part 29a so as to cover an opening in the case 29 by supporting a circuit board 6 described later. The stepped part 29b that is distant from the bottom surface is mounted so as to cover the circuit board 6 by supporting a cover member 8 described later.

As shown in FIGS. 6 to 8, a terminal output hole 23 is arranged so that an external output terminal 7 described later can penetrate the same. The external output terminal 7 described later passes into and penetrates the terminal output hole 23 while loosely inserted inside the second slit 35. The terminal output hole 23 with the external output terminal 7 described later threaded is fixed to and embedded in the sensor housing 2 to prevent the external output terminal 7 described later from coming into contact with the bus bar 3 in which a current flows where the second slit 35 is arranged. The bus bar 3 in which a current flows is thus insulated from the external output terminal 7 described later.

The housing 28 is integrated with the sensor housing 2 while embedded in a surface opposite to the case 29. The housing 28 is formed into a cylindrical shape to accommodate the tip 72 of the external output terminal 7 described later. The housing 28 protrudes from the horizontal part 24 between the battery 9 and the suspending part 25 of the sensor housing 2. In the housing 28, the tip 72 of the external output terminal 7 described later is passed into the terminal output hole 23 and penetrates the same and is accommodated therein while loosely inserted inside the second slit 21.

The suspending part 25 covers part of the second flat plate 39 arranged on the starter bus bar 32 and part of the second flat plate 39 arranged on the alternator bus bar 33 with insert-molding. The suspending part 25 includes a terminal accommodating part 26. The suspending part 25 embeds the second flat plate 39 of the bus bar 3 and the terminal accommodating part 26 described later in the sensor housing 2 while integrated thereto.

The terminal accommodating part 26 is arranged at an end away from the horizontal part 24 of the suspending part 25. The terminal accommodating part 26 is integrated with the sensor housing 2. The terminal accommodating part 26 is formed into a cylindrical shape and accommodates the connection bus bars 32d and 33b described above.

Figure 9:
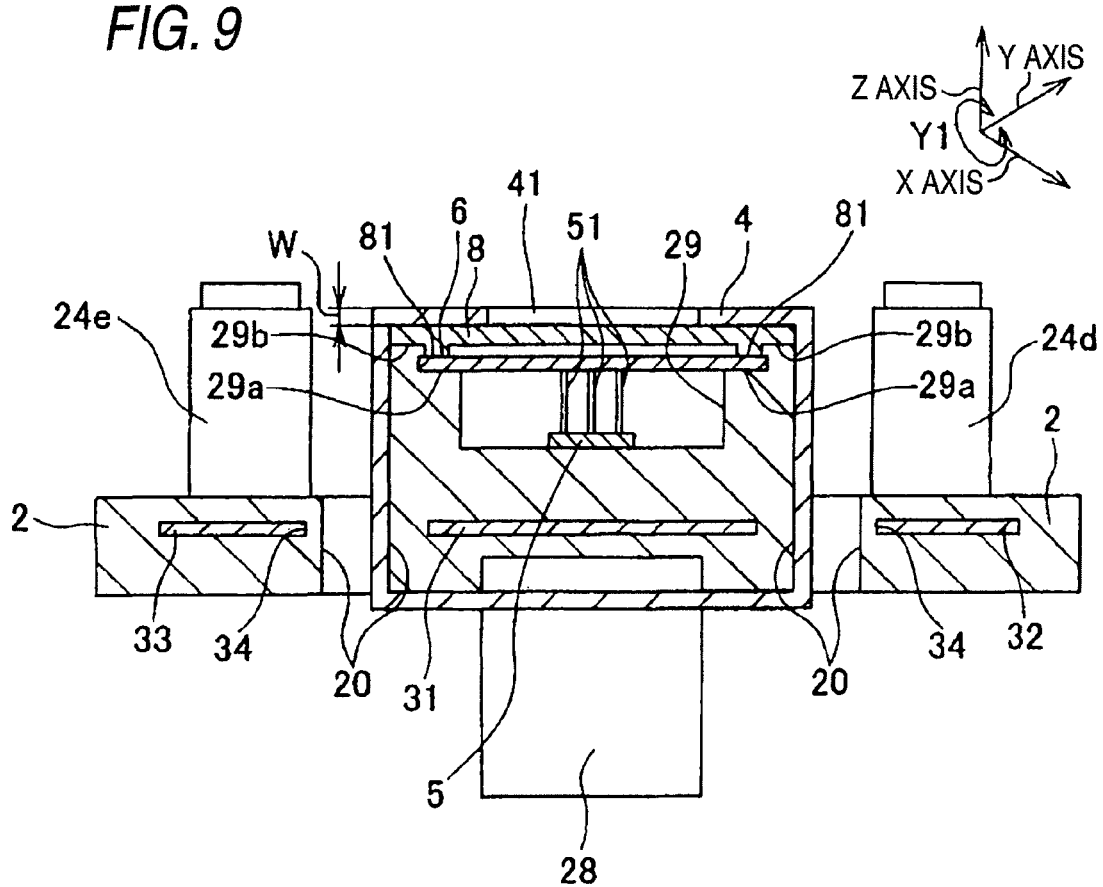
FIG. 9 is a cross-sectional view taken along line B-B of FIG. 6.

As shown in FIG. 9, the core 4 as a shield plate is arranged to surround the Y axis as the direction of the current flow in the bus bar 3. The core 4 is formed into an annular shape having an almost rectangular cross section. In the center of the Y axis in the circumferential direction Y1 is arranged a gap 41. At the gap 41 the magnetic flux density of a generated magnetic field is peaked. The core 4 is inserted via the opening in the first slit 20 of the sensor housing 2 when it is brought near the sensor housing 2 in the direction of the arrow K1 shown in FIG. 3.

The Hall IC 5 as a magnetic-electric conversion element detects the magnetic flux density generated when a current flows in the bus bar 3 and converts it to an electric signal. The Hall IC 5 is mounted on the bottom surface of the case 29 described above. The Hall IC 5 electrically connects to a circuit board 6 described later via a terminal 51 arranged on the opposite surface to the bottom surface of the case 29. To the Hall IC 5 is supplied power via the terminal 51, the circuit board 6 and the external output terminal 7 described later.

The circuit board 6 is formed into a flat plate. The circuit board 6 includes a terminal insertion hole (not shown). The terminal insertion hole into which the external output terminal 7 described later is inserted is arranged in the surface of the circuit board 6 to which the terminal 51 of the Hall IC 5 is connected. On the surface of the circuit board 6 opposite to the surface connected to the terminal 51 of Hall IC 5 is arranged a cover member 8 described later. As shown in FIG. 9, the circuit board 6 is mounted on the stepped part 29a of the case 29 described above. On the circuit board 6 is formed a conductive pattern used to connect the terminal 51 of the Hall IC 5 and the external output terminal 7 described later.

The external output terminal 7 is formed of one end 71 to be inserted into a terminal insertion hole (not shown) arranged in the circuit board 6 and a tip 72. As shown in FIG. 6, the one end 71 of the external output terminal 7 is inserted in a protruding fashion into the terminal insertion hole and is soldered thereto and electrically connected to the circuit board 6 and fixed thereto. The external output terminal 7 outputs an electric signal from the Hall IC 5. The external output terminal 7 is bent and formed into a clamp shape. The tip 72 of the external output terminal 7 is loosely inserted into the terminal output hole 23 of the sensor case 27 described above and penetrates the terminal output hole 23 so as not to come into contact with the inner surface of the second slit 35 arranged on the bus bar 3. The tip 72 of the external output terminal 7 extends parallel to the side surface 9b of the battery 9 between the side surface 9b of the battery 9 and the suspending part 25 of the sensor housing 2 and is accommodated in the housing 28. The external output terminal 7 is embedded into the sensor housing 2 via insertion-molding and is integrated thereto.

The cover member 8 is formed with a non-magnetic body. The cover member 8 is formed into a flat plate. The length of the cover member in the width direction is almost equal to the longitudinal length of the inner surface of the core 4 described above. The cover member 8 is arranged to cover the circuit board 6 on a surface opposite to the surface to which the terminal 51 of the Hall IC 5 of the circuit board 6 is connected, thus preventing invasion of foreign matters such as dust and water in the case 29. The cover member 8 includes a pair of legs 81. The pair of legs 81 is arranged on one surface of the cover member 8. Each of the legs 81 as a pair protrudes longitudinally from the end of the cover member 8 in the direction of width with a spacing provided from the cover member 8. The pair of legs 81 is mounted on the stepped part 29b of the case 29.

Figure 10:
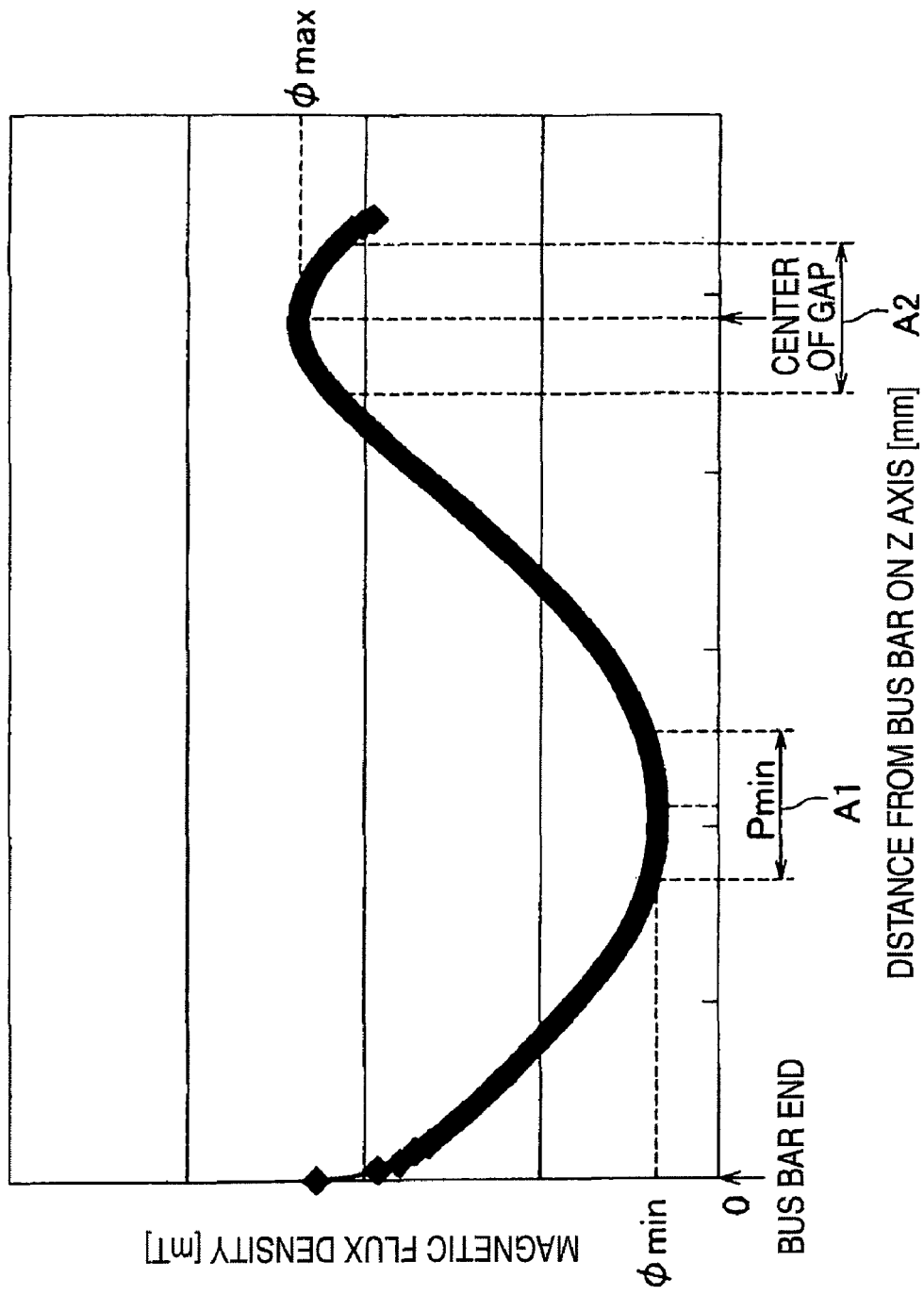
FIG. 10 is a graph showing the relationship between the distance from a bus bar on an axis passing through the center of a gap and perpendicular to the bus bar, and the magnetic flux density.

Next, the distance from the bus bar 3 described above and the positional relationship between the core 4 and the Hall IC 5 will be described. FIG. 10 is a graph illustrating the relationship between the distance from the bus bar 3 on the Z axis shown in FIG. 9 and the magnetic flux density. As shown in FIG. 10, the magnetic flux density of the magnetic field from the bus bar 3 decreases with the distance from the bus bar 3 to take the minimum value $\phi$ min and increases as the gap 41 is drawing near under the effect of the leakage magnetic flux from the core 4 and takes the maximum value $\phi$ max at the center of the gap 41.

As understood from FIG. 10, the region A1 near the position Pmin where the minimum value of magnetic flux density $\phi$ min is obtained shows a gentle change in the magnetic flux density compared with the region A2 of the gap 41. That is, in the region A1, a small change is observed in the magnetic flux density to correspond to the variations in the position the core 4 is arranged irrespective of the dimensional width W of the core 4 (FIG. 9) than in the region A2. Thus, in this embodiment, the core 4 is arranged in the position Pmin where the magnetic flux density previously measured is the minimum value φ min. The position Pmin where the magnetic flux density takes the minimum value φ min differs with products.

With this arrangement, it is possible to arrange the Hall IC 5 in the region A1 where slight variations in the position of the Hall IC 5 do not influence the gentle change in the magnetic flux density. As described above, the change in the magnetic flux density is small even when the case 29 extends/shrinks with a change in the ambient temperature thus changing the position of the hall IC 5. Thus, the variations in the output of the Hall IC 5 are negligible, and the currents can be accurately measured.

Next, the procedure for assembling the current sensor 1 will be described. As described earlier, the bus bar 3, the case 29 of the sensor case 27, the housing 28, the external output terminal 7, and the terminal accommodating part 26 of the suspending part 25 are integrally insert-molded on the sensor housing 2. The external output terminal 7 and the inner surface of the second slit 35 are embedded and fixed so as to avoid mutual contact. The external output terminal 7 passes through the terminal output hole 23 in the sensor case 27, penetrates the same while loosely inserted inside the second slit 35, and is accommodated in the housing 28. Next, the terminal 51 of the Hall IC 5 is soldered to the circuit board 6 to provide electric connection. The Hall IC 5 is mounted on the bottom surface of the case 29. Next, one end 71 of the external output terminal 7 is inserted into the terminal insertion hole in the circuit board 6 and the one end 71 is soldered to the circuit board 6. This electrically connects and fixes the external output terminal 7 to the circuit board 6. Next, the circuit board 6 to which the terminal 51 of the Hall IC 5 and the one end 71 of the external output terminal 7 are fixed is arranged, from the opening in the case 29, on the stepped part 29a of the case 29 so as to cover the opening in the case 29. Next, the legs 81 of the cover member 8 are arranged on the stepped part 29b and the cover member 8 is mounted to cover the circuit board 6. Finally, the core 4 is inserted via the opening of the pair of first slits 20 to complete the current sensor 1.

Figure 11:
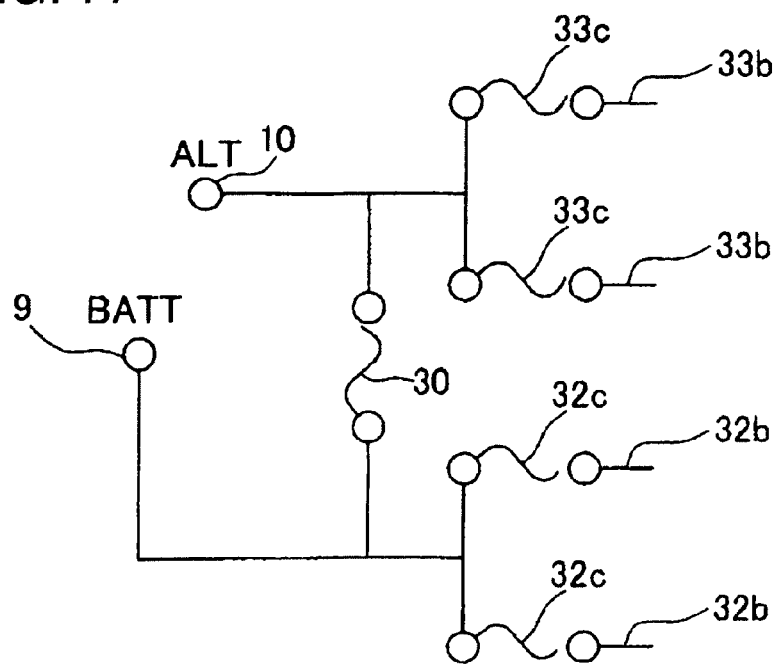
FIG. 11 is a circuit diagram of the current sensor according to the first embodiment.

Current flow in the current sensor 1 will be described referring to FIG. 11. A starter (not shown) electrically connects a starter bus bar 32, that is, the current sensor 1 and the starter via wiring and terminal fitting connected to the starter and a connection bolt 24d. Next, an alternator 10 electrically connects an alternator bus bar 33, that is, the current sensor 1 and the alternator 10 via wiring and terminal fitting connected to the alternator 10 and the connection bolt 24e. The procedure for connecting a power source bus bar 31, that is the current sensor 1 and the battery 9 have been described and is omitted here. First, the starter mounted on the starter bus bar 32 forcibly rotates the engine with the current from the battery 9 mounted on the power source bus bar 31. Upon rotation of the motor, the alternator 10 mounted on the alternator bus bar 33 generates electricity. The alternator 10 rotates to generate a current. The current generated by the alternator 10 is supplied to loads such as a lamp and audio equipment connected to the connection bus bar 32b via a fuse element 33c. The current is then supplied to a load connected to the connection bus bar 32b via a fuse element 30 and a fuse element 32c. Finally, the residual current is used to charge the battery 9. When an overcurrent flows, the fuse element 30 shuts down electric connection to prevent the overcurrent from flowing into the battery 9 and a plurality of loads connected via the connection bus bar 32b. The current sensor 1 measures the current in order to monitor the charging/discharging state of the battery 9.

With the current sensor 1, the first slit 20 moves the core 4 in the direction of the arrow K1 to position the Hall IC 5 described later in a space enclosed by the core 4. It is thus possible to mount the core 4 by inserting the core 4 into the first slit 20, without fixing shield plates divided to surround the axis extending in the direction of current flow in the bus bar 3. This provides a current sensor 1 with reduced number of parts and mounting man-hours.

The external output terminal 7 and the tip 72 of the external output terminal 7 penetrate the second slit 35 while inserted loosely inside the second slit 35 and extend in a direction orthogonal to the end surface 9a of the battery 9. This positions the tip 72 of the external output terminal 7 described later in a free space between the side surface 9b of the battery 9 and the suspending part 25 of the sensor housing 2 described later. It is thus possible to effectively use the free space, thereby downsizing the current sensor 1.

The tip 72 of the external output terminal 7 penetrates the second slit 35 while inserted loosely inside the second slit 35 and extends in a direction orthogonal to the end surface 9a of the battery 9. This makes it possible to mount the battery 9 without being restricted by the peripheral shape of the battery post 91.

A current sensor 1 according to the second embodiment of the invention will be described referring to FIG. 12. The same component as that in the first embodiment is given the same sign and redundant description is omitted.

A terminal output hole 23A is arranged to allow an external output terminal 7A described later to penetrate the same. Unlike the first embodiment, as shown in FIG. 12, the terminal output hole 23A penetrates the side of a case 29 and guides the external output terminal 7A described later parallel to an end surface 9a of a battery 9 in a direction leaving the battery 9.

A housing 28A is integrated with the sensor housing 2 while embedded therein. The housing 28A protrudes from an end of a horizontal part 24 close to a suspending part 25. The housing 28A is formed into a cylindrical shape to accommodate the tip 72A of an external output terminal 7A described later.

Unlike the first embodiment, the external output terminal 7A is formed into an L shape. As shown in FIG. 12, the external output terminal 7A described later is inserted into a terminal insertion hole in a circuit board 6 so that one end 71A will protrude from the surface to which the terminal 51 of a Hall IC 5 of the circuit board 6 is connected. The tip 72A penetrates the terminal output hole 23A and is accommodated in the housing 28A. According to the second embodiment, unlike the first embodiment, the tip 72A of the external output terminal 7A extends parallel to the end surface 9a of the battery 9 in a direction leaving the battery 9.

Figure 12:
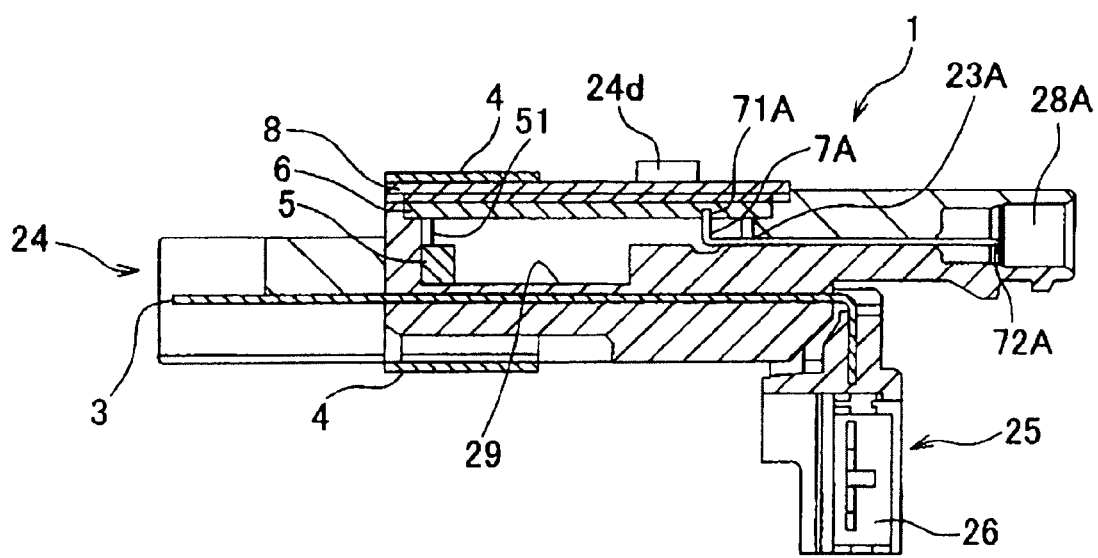
FIG. 12 is a cross-sectional diagram of the current sensor according to the second embodiment.
Figure 13:
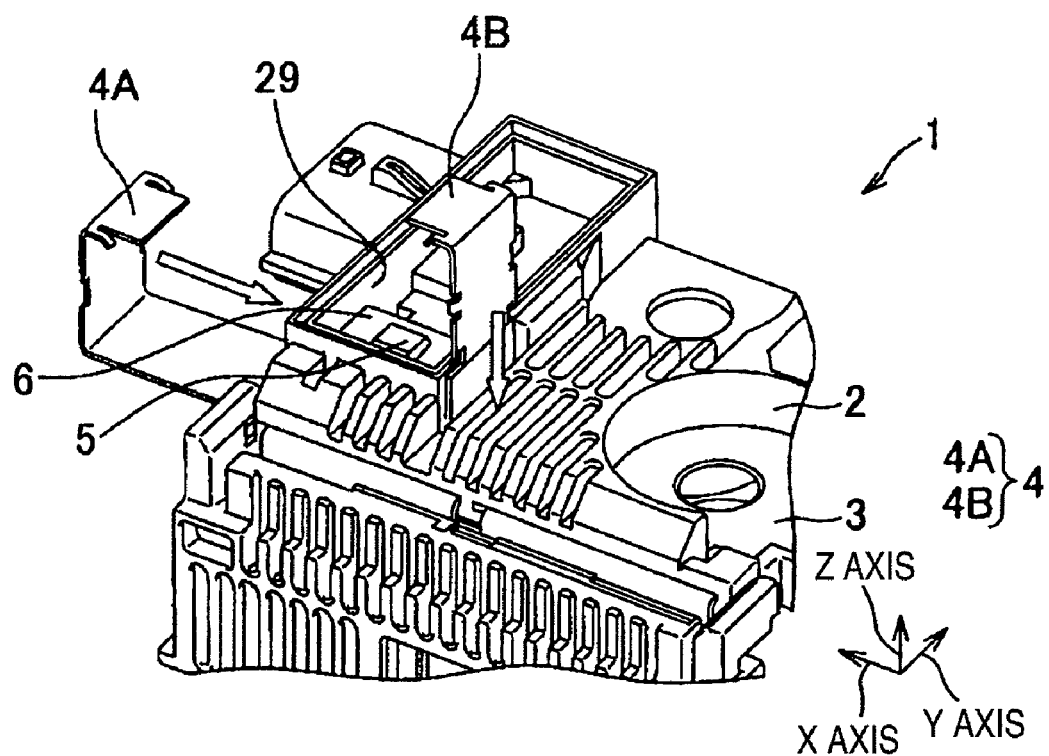
FIG. 13 is a perspective view showing an example of a related current sensor.

As shown in FIG. 12, according to the second embodiment, the tip 72A of the external output terminal 7A extends parallel to the end surface 9a where a battery post 91 is arranged and is provided in a direction leaving the battery 9. According to the second embodiment, unlike the first embodiment, it is possible to arrange the external output terminal 7A without providing a second slit 35 in a bus bar 3. This makes it possible to mount a Hall IC 5 without influencing the shape, for example punching out the sheet metal to create the second slit 35.

As shown in FIG. 12, the tip 72A of the external output terminal 7A extends parallel to the end surface 9a where the battery post 91 is arranged and in a direction leaving the battery 9. This makes it possible to mount the battery 9 without being restricted by the peripheral shape of the battery post 91.

While the second slit 35 is provided in an almost rectangular shape by notching the bus bar 3 in the first embodiment, the second slit may be in the shape of a hole where the external output terminal 7 is loosely insertable.

The side part of a starter bus bar 32 close to an alternator bus bar 33 that forms one first slit 34 of the first slits 34 as a pair arranged in the bus bar 3 and the side part of the alternator bus bar 33 close to the starter bus bar 32 that forms the other first slit 34 may be omitted. In other words, the first slit 34 in the bus bar 3 may be omitted. Only a first slit 20 should be arranged in the sensor housing 2.

The Hall IC 5 need not be arranged in a space enclosed by a core 4 as a shield plate. The Hall IC 5 may be arranged outside the space enclosed by the core 4 as a shield plate. The Hall IC 5 may be arranged in a gap 41.

While the tip 72 of the external output terminal 7 extends along the side surface 9b of the battery 9 in a direction orthogonal to the end surface 9a of the battery 9 in the first embodiment, the tip 72 of the external output terminal 7 may extend in an opposite direction leaving the battery 9.

The foregoing embodiments are only representative aspects of the invention. The invention is by no means limited by the embodiments. Changes to the invention are possible without departing from the spirit of the invention.

The present application is based on Japanese Patent Application No. 2008-238955 filed on Sep. 18, 2008, the contents of which are incorporated herein for reference.

What is claimed is:

1. A current sensor comprising:
    a housing having a pair of first slits;
    a bus bar supported by the housing and electrically connected to a battery post provided on a battery;
    an annular shield member arranged so as to surround an axis extending in a direction in which a current is flowed in the bus bar; and
    a magnetic-electric conversion element provided on the housing to detect a magnetic flux density of a magnetic field generated when the current is flowed in the bus bar and produce an electric signal,
    wherein the magnetic-electric conversion element is arranged between the first slits; and
    wherein the shield member is inserted into the first slits so that the shield member is mounted on the housing.

2. The current sensor according to claim 1, wherein a tip of an external output terminal for outputting the electric signal from the magnetic-electric conversion element is loosely inserted into and passed through a second slit provided on the bus bar, and extends in a direction orthogonal to an end face of the battery where the buttery post is provided.

3. The current sensor according to claim 1, wherein the tip of an external output terminal for outputting the electric signal from the magnetic-electric conversion element extends, in parallel to an end face where the battery post is provided, so as to away from the battery.

4. The current sensor according to claim 1, wherein the shield member has a box like shape having a lower wall and side walls which a perpendicular to the lower wall; and
    wherein the side walls are inserted into the first slits of the housing.

* * * * *